United States Patent
Harvilchuck

(10) Patent No.: US 9,007,766 B2
(45) Date of Patent: Apr. 14, 2015

(54) STORAGE ENCLOSURE WITH PIVOTABLY MOUNTED MIDPLANE ASSEMBLY

(75) Inventor: Laurence A. Harvilchuck, Brackney, PA (US)

(73) Assignee: Xyratex Technology Limited, Havant, Hampshire (GB)

( * ) Notice: Subject to any disclaimer, the term of this patent is extended or adjusted under 35 U.S.C. 154(b) by 319 days.

(21) Appl. No.: 13/443,636

(22) Filed: Apr. 10, 2012

(65) Prior Publication Data

US 2013/0265725 A1   Oct. 10, 2013

(51) Int. Cl.
H05K 7/20 (2006.01)
H05K 5/00 (2006.01)

(52) U.S. Cl.
CPC ........ H05K 7/20727 (2013.01); H05K 7/20136 (2013.01)

(58) Field of Classification Search
USPC ............... 361/679.46–679.54, 688–727, 752, 361/755, 787; 165/80.2, 185; 257/712–713, 257/721; 174/547; 454/184
See application file for complete search history.

(56) References Cited

U.S. PATENT DOCUMENTS

| 5,235,494 | A | 8/1993 | Chang et al. | |
|---|---|---|---|---|
| 6,545,873 | B1* | 4/2003 | Han et al. | 361/728 |
| 7,871,319 | B2* | 1/2011 | Tracy et al. | 454/184 |
| 2003/0128529 | A1* | 7/2003 | Jansen | 361/752 |
| 2003/0161114 | A1* | 8/2003 | Berry et al. | 361/727 |
| 2004/0057223 | A1 | 3/2004 | Hall | |
| 2004/0070955 | A1* | 4/2004 | Dobbs et al. | 361/752 |
| 2007/0291452 | A1* | 12/2007 | Gilliland et al. | 361/699 |
| 2009/0173473 | A1* | 7/2009 | Day | 165/67 |
| 2010/0319969 | A1* | 12/2010 | Vasoya et al. | 174/257 |
| 2011/0072290 | A1 | 3/2011 | Davis et al. | |
| 2011/0222234 | A1 | 9/2011 | Davis et al. | |
| 2011/0222235 | A1 | 9/2011 | Easton | |
| 2011/0246793 | A1 | 10/2011 | Davis | |
| 2012/0020005 | A1 | 1/2012 | Collins | |
| 2012/0020007 | A1 | 1/2012 | Collins | |
| 2012/0081856 | A1* | 4/2012 | Hopkins et al. | 361/679.33 |

FOREIGN PATENT DOCUMENTS

GB   720762   12/1954

OTHER PUBLICATIONS

United Kingdom Search and Examination Report dated May 31, 2013 in corresponding Great Britain Patent Application No. GB1301150.7.

* cited by examiner

Primary Examiner — Zachary M Pape
(74) Attorney, Agent, or Firm — Hall Estill Attorneys at Law

(57) ABSTRACT

The invention provides storage enclosure, comprising an enclosure housing; one or more drawers slidably arranged within the enclosure housing, wherein each drawer has a pivotably mounted midplane having storage media coupled thereto wherein the storage media are coupled to both sides of the pivotably mounted midplane.

16 Claims, 11 Drawing Sheets

Blade System

Drawer System

Midplane Open Position

Midplane Shut Position

STORAGE ENCLOSURE WITH PIVOTABLY MOUNTED MIDPLANE ASSEMBLY

The present invention relates to a storage enclosure and a method of accessing components within a storage enclosure. The components are typically storage media but may be any type of components typically provided within a storage enclosure. Examples include controllers and expanders. The components may be SCSI components such as SAS expanders.

The primary field of use for the present method and apparatus is in the arrangement and configuration of storage systems such as storage enclosures or racks. FIGS. 1 and 2 show schematic representations of examples of storage systems.

Storage systems typically include plural storage media arranged somehow to enable data to be written to and read from individual storage media. The plural storage media are interconnected to storage interface modules to create a storage system. The media may be disk drives, solid state drives, or any other form of data storage medium. The storage interface modules may be interface switches, interface controllers, RAID controllers, processing modules or similar. The storage interface modules may be located remotely to the storage media, for example in the rear of an enclosure where the storage media are in the front of the enclosure, or co-located with the storage media, for example Interface switches (e.g. SAS Expanders) co-located with the disk drives in the front of an enclosure.

As the size and capacity of storage systems increases, there is an increasing need to provide efficient and effective means for accessing the individual storage media within a storage enclosure or system. Typically, a storage system includes storage modules which each contain plural disk drives and storage interface modules which provide internal and external connectivity between the storage media and the storage system external data fabric.

A typical example of a known storage system uses a 'blade' type structure. The blade is high but narrow, allowing multiple blades to be fitted across the width of a rack, typically 10 or 12. Depth is determined by the number of drives being installed, but each blade would typically be 3 drives deep (of the order of 500 mm). The structure of the blades limits the airflow across the installed devices and the density that can be achieved. Fully loaded blades can be heavy and this limits the maintenance and serviceability of the resultant system. The weight of the blades also requires a structure across the width of the rack to provide physical support.

FIG. 1 shows a schematic representation of such a blade storage system. As can be seen the storage system 1, comprises plural blades 3 arranged within the housing 5 of the storage system 1. Structure (not shown) across the width of the rack is provided to support the weight of the blades. The housing 5 is in the form of what is typically referred to as a rack.

In contrast, a drawer-based system, as shown in FIG. 2, uses a sliding drawer the full (or half the) width of the rack, but of low height. The height is governed by the storage media (or storage interface modules) installed, such each individual storage medium, e.g. an individual disk drive, is accessible and serviceable from the top of the drawer when the drawer is open, i.e. slid out of the housing. FIG. 2 shows the rack with all the drawers closed and, separately, a single storage module 7 as might be provided in the rack 5. The module 7 contains two drawers, one of which 11 is open and the other of which 13, is closed.

The depth of the drawer is determined by the number of storage media installed, but is not limited in the same way as the blade. Since every storage media is individually serviceable the overall weight of the drawer does not become a serviceability limit. In contrast to the blade, the drawer is supported at its sides by the rack structure, relying on the strength of the drawer itself to provide support for the installed storage media.

One known storage system is the ClusterStor system of the present assignee, as described in each of U.S. Ser. No. 12/722, 012, U.S. Ser. No. 12/843,725 and U.S. Ser. No. 12/843,711, the entire contents of all of which are hereby incorporated by reference. The ClusterStor system comprises a rack into which are placed plural storage modules. Each of the storage modules contains two drawers which, in turn, each contain plural disk drives. At the rear of the storage system, storage interface modules provide control, input and output functionality. This is the means by which data may be written to or read from disk drives within the storage system.

As the density and number of storage media within a storage enclosure increases so does the need for quick and easy access to the individual storage media.

According to a first aspect of the present invention, there is provided a storage enclosure, comprising a housing; a midplane, pivotably mounted within the housing, having components such as storage media coupled thereto wherein the components are coupled to both sides of the midplane.

In another embodiment, components other than storage media could be mounted on the midplane. For example, expanders, controllers or indeed any other components could be provided on the midplane as well as or instead of the storage media.

Thus, a storage enclosure is provided that provides both high density and high availability of individual storage media within the enclosure. A pivotable midplane is provided, which has mounted on both sides storage media and/or other components such as expanders and controllers etc. When in a first closed configuration, i.e. with the midplane lying substantially flat within the drawer, the storage media on the upper or exposed surface of the midplane can be readily and easily accessed. Hot-swapping is thus enabled for each of the individual storage media or other components on either side of the midplane. When the midplane is pivoted upwards, the underside of the midplane becomes exposed thereby providing similarly easy and ready access to the storage media and other components on the lower side of the midplane. This a simple and robust arrangement is provided whereby high density of storage media can be achieved without sacrificing availability due to the pivoted nature of the midplane and the provision of storage media on both sides of the midplane.

As used herein terms such as "upper", "upwards", "lower", "down", "underside" etc will be understood in context typically to refer to the relationship between the surface being referred to and the base of the housing or drawer.

In an embodiment, the housing defines a drawer slidably arranged within a rack. The use of a drawer structure enables the storage enclosure to be easily and conveniently scalable. Furthermore, the sliding movement of the drawer (to open the drawer from the rack), enables each drawer in a multi-drawer rack to be individually serviceable.

In an embodiment, when the drawer is opened, the pivotably mounted midplane is movable between a first closed configuration in which the plane is flat within the drawer and a second open configuration in which the plane is pivoted upwards to provide access to both the top side and the underside of the plane.

Thus, the pivoted nature of the midplane enables a high density of storage media to be achieved since in the open configuration, the media on the lower side of the midplane can be easily accessed.

In an embodiment, the pivotably mounted midplane is spring-biased to the second open configuration. This ensures that it is easy for user to move the midplane into the open configuration from the closed configuration. It also provides a degree of safety as it stops the midplane falling (or at least damps any such falling) back into the closed configuration.

In an embodiment, the storage enclosure comprises a manually engagable lock mechanism to lock the pivotably mounted midplane in the first closed configuration, and arranged upon activation of the lock mechanism to automatically move to the second open configuration.

In an embodiment, the manually engagable lock mechanism comprises a locking arm having a first end including a locking finger to engage the drawer, and at the other end an opening to engage a locking nut provided on the midplane rotation shaft. Alternatively a keyed moving interlocking surface could be provided instead of the locking nut.

In an embodiment, the drawer has opposing longitudinal sides and the midplane is pivotally mounted to or in the region of one of the longitudinal sides.

In an embodiment, the drawer has a removable lid, arranged in normal use on top of the pivotably mounted midplane within the drawer.

In an embodiment, the storage enclosure or drawer comprises a heat exchanger thermally coupled to the pivotably mounted midplane.

In an embodiment, the heat exchanger is an integral part of the pivotably mounted midplane. In other words the midplane could include a heat exchanger over and above the heat exchanger in the case, lid or base In an embodiment, the pivotably mounted midplane comprises a Printed Circuit Board substrate on which is mounted plural solid state drives.

In an embodiment, the pivotably mounted midplane comprises a composite structure including a core heat exchanger layer and upper and lower PCB layers on which are mounted the plural solid state drives.

In an embodiment, the drawer has a base comprising a heat exchanger, arranged in use to remove heat from the storage media on the underside of the pivotably mounted midplane.

In an embodiment, the lid comprises a heat exchanger, arranged in use to remove heat from the storage media on the upper side of the pivotably mounted midplane.

In an embodiment, the heat exchanger is a porous heat exchanger.

In an embodiment, the enclosure or drawer comprises one or more fans arranged to generate a flow of air through the porous heat exchangers.

In an embodiment, the storage enclosure is liquid cooled and there are provided conduits for heat transfer fluid in thermal communication with the heat exchangers.

In an embodiment, the lid has openings for venting.

Furthermore, as the density and number of storage media within a storage enclosure increases, efficient and effective temperature control of the individual storage media is also desired. It is known to pass cooling air through the storage system so as to remove heat produced in operation by the disk drives and thereby provide cooling to the storage system as a whole.

According to a second aspect of the present invention, there is provided a method of accessing components such as storage media within a storage enclosure, in which the storage enclosure comprises a housing, and the components are provided on both surfaces of the midplane within the housing, the method comprising: providing the midplane as a pivotable midplane arranged to pivot from a first closed configuration in which the midplane is arranged flat within the housing, and a second open configuration, in which the midplane is pivoted to extend out of the housing; pivoting the midplane to the second configuration from the first configuration so as to enable access to the components on the underside of the midplane.

A method is provided that enables high density and high availability of individual components, such as storage media, within an enclosure. A pivotable midplane is provided, which has mounted on both sides storage media. When in a first closed configuration, i.e. with the midplane lying substantially flat within the housing, the storage media on the upper or exposed surface of the midplane can be readily and easily accessed. When the midplane is pivoted upwards, the underside of the midplane becomes exposed thereby providing similarly easy and ready access to the storage media on the lower side of the midplane. Thus, a simple and robust method of accessing storage media is provided. A high density of storage media can be achieved without sacrificing availability due to the pivoted nature of the midplane and the provision of storage media on both sides of the midplane.

In an embodiment, the housing may be a drawer within an outer housing and the method comprises, prior to the step of pivoting the midplane, pulling the drawer so that it extends out of the housing. Thus, a scalable system is provided since plural drawers can be provided in a larger enclosure. Each of the drawers enables high access and availability as described above.

According to a third aspect of the present invention, there is provided a storage enclosure, comprising an enclosure housing; one or more drawers slidably arranged within the enclosure housing, wherein each drawer has a pivotably mounted midplane having storage media coupled thereto wherein the storage media are coupled to both sides of the pivotably mounted midplane.

Embodiments of the present invention will now be described in detail with reference to the accompanying drawings, in which.

Figure 3B:
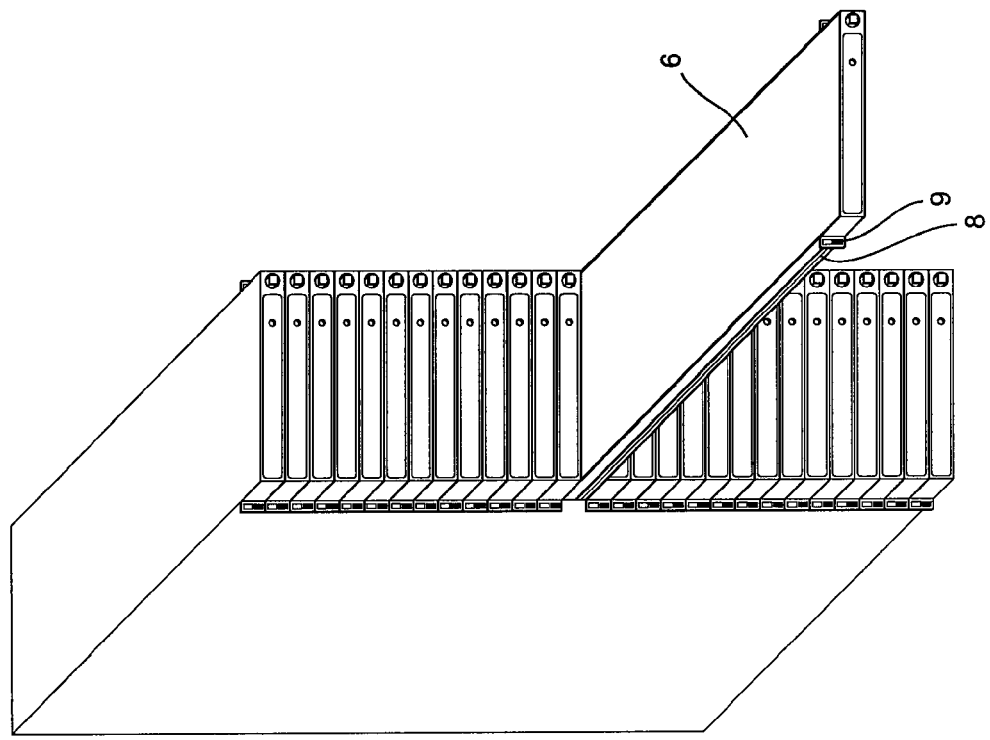
FIGS. 3A to 3D show schematic representations of a storage enclosure with a drawer-like configuration showing a drawer at various stages of opening.
Figure 3A:
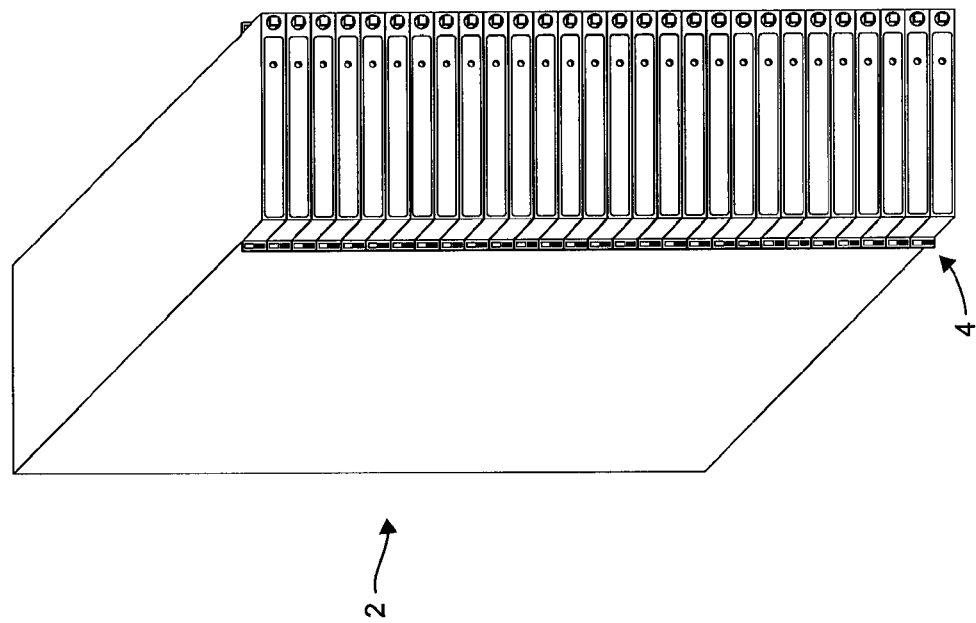
Figure 3D:
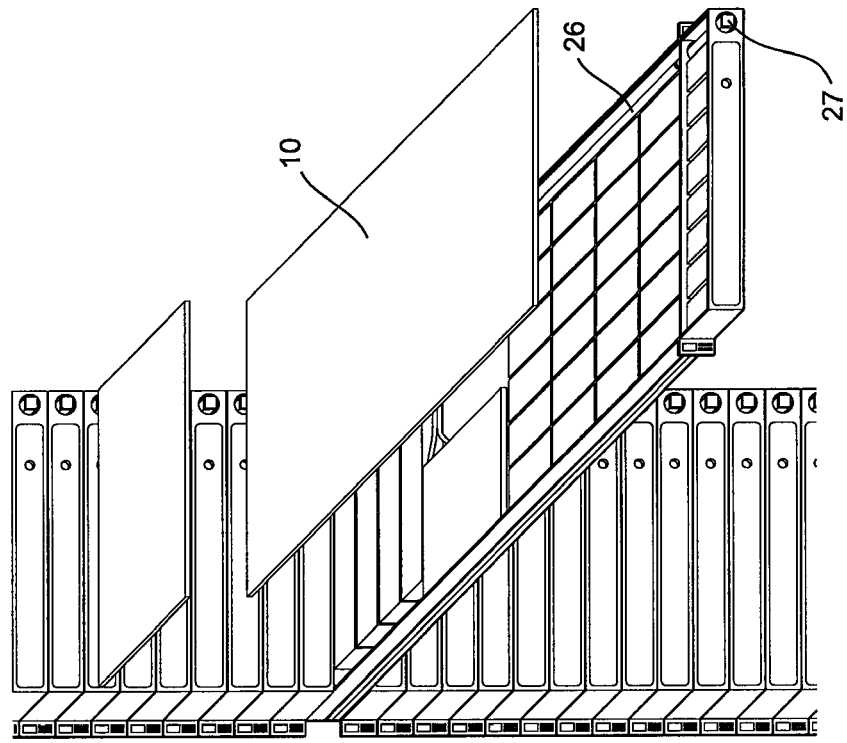

Referring to FIG. 3A, an example of a storage enclosure 2 is shown. The storage enclosure 2 may be a rack or part of rack. The storage enclosure 2 is a drawer-based structure, comprising plural drawers 4 each containing plural storage media (shown in FIGS. 3C and 3D). Each individual drawer 6 can be moved, with respect to the rest of the storage system 2, between a closed configuration as shown in FIG. 3A and an open configuration as shown in FIG. 3B. Runners 8 are provided at the edges of the drawers to facilitate easy movement of the drawer 6 between the closed and open configurations. Runner stops 9 are provided to limit the degree of movement of the drawer 6 into the enclosure housing. Similarly, although not shown, some mechanism for stopping the drawer easily leaving the enclosure housing may also be provided at the opposite longitudinal end of the runners from the stops 9.

Figure 3C:
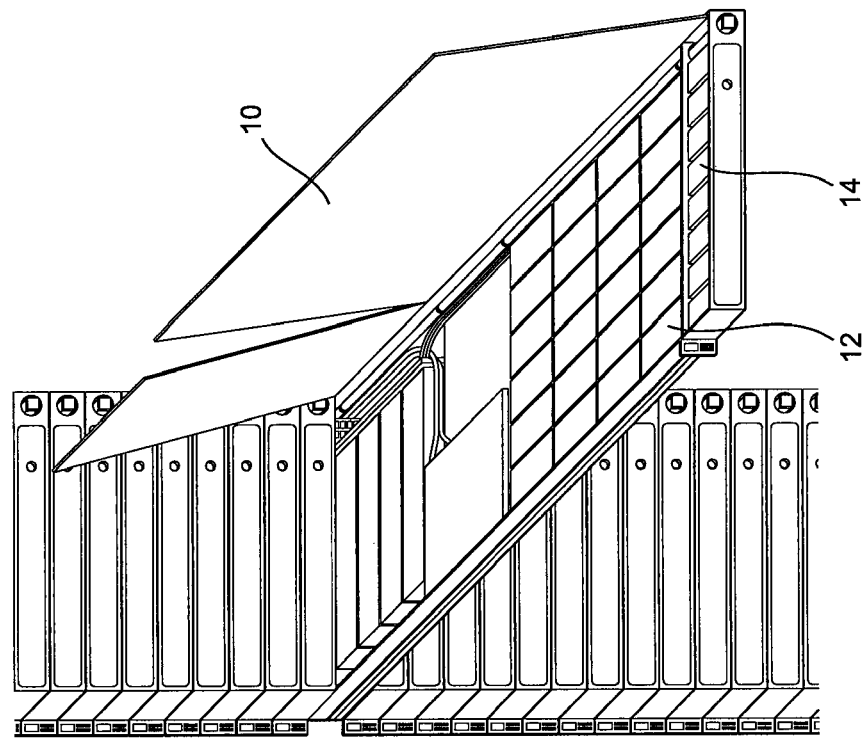

As shown in FIG. 3C, a lid or top section 10 is provided on each drawer 6. The lid 10 is preferably pivotally mounted to enable access to storage media within the drawer 6 when the lid 10 is open. Each drawer 6 has a midplane arranged within it, described in detail below. The midplane has storage media 12 arranged in some configuration on it. As will be explained below, the midplane itself is pivotally mounted such that storage media 12 arranged on both of the upper and lower surfaces (with respect to the drawer) thereof can, in use, be easily and conveniently accessed. Preferably the lid 10 has one or more openings (not shown) to provide venting. For example, the lid could have plural openings and/or be a lattice type structure enabling air (and heat) to flow easily through it.

It will be appreciated that although described in detail with reference to a drawer-based arrangement, the use of a pivoted midplane is not limited to drawer-based storage systems. The pivoted midplane could be used in a single tray-type storage system as well. The skilled person will appreciate that most of the features described herein with reference to the drawer-based storage system could apply also to a storage system that is not drawer-based.

Figure 1:
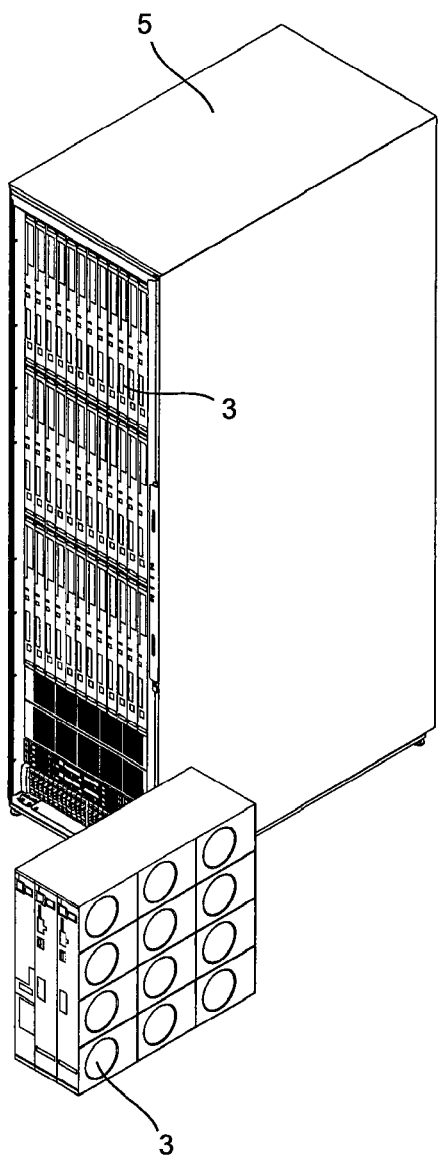
FIGS. 1 and 2 show schematic views of storage enclosures.
Figure 2:
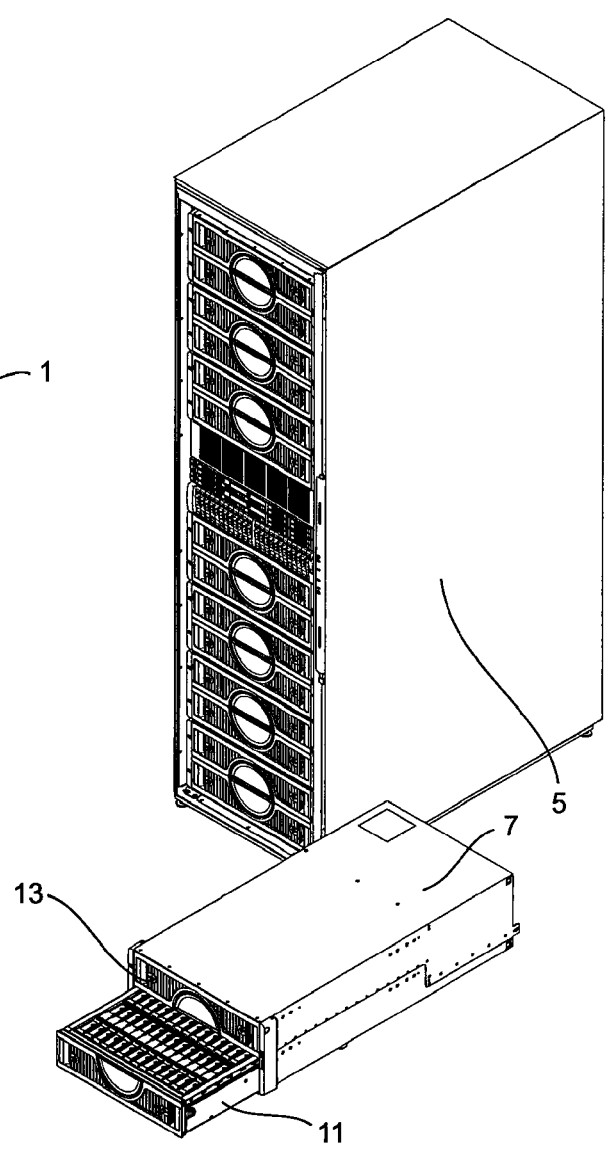

In a conventional storage enclosure, e.g. such as that shown in FIGS. 1 and 2, a midplane is arranged as a separate component configured vertically between the controllers and I/O units at the "back" of the enclosure and the storage media on the blades at the "front". Thus, logically it provides structure between the controllers and I/O units on the one hand and the storage media on the other. In the present embodiments, the midplane is also structure that is logically between the controllers and I/O units on the one hand and the storage media on the other, except the storage media are mounted on it and it is arranged pivotally within a housing such as a drawer. In some cases, the midplane may be considered a storage plane as it is the plane on which the storage media are mounted.

Referring again to FIG. 3C, within the drawer 6 there are provided one or more cooling devices 14 arranged to provide cooling of the storage media 12. The cooling devices 14 are typically fans arranged at the front end of the drawer 6. Rotational fans or any other type of air flow generating device could be used.

The lid 10, which is typically a sheet of metal, plastic or composite material, may be fixedly pivotally mounted to the drawer such that in the open configuration, it remains connected to the drawer. Alternatively, the lid 10 may simply be a removable planar sheet (see FIG. 3D) which can be taken off the drawer when opened so as to provide access to the midplane, to be described below. In some examples, the lid is removable and pivotally mounted such that it can both be pivoted into an open configuration when desired and removed completely if required.

Figure 4:
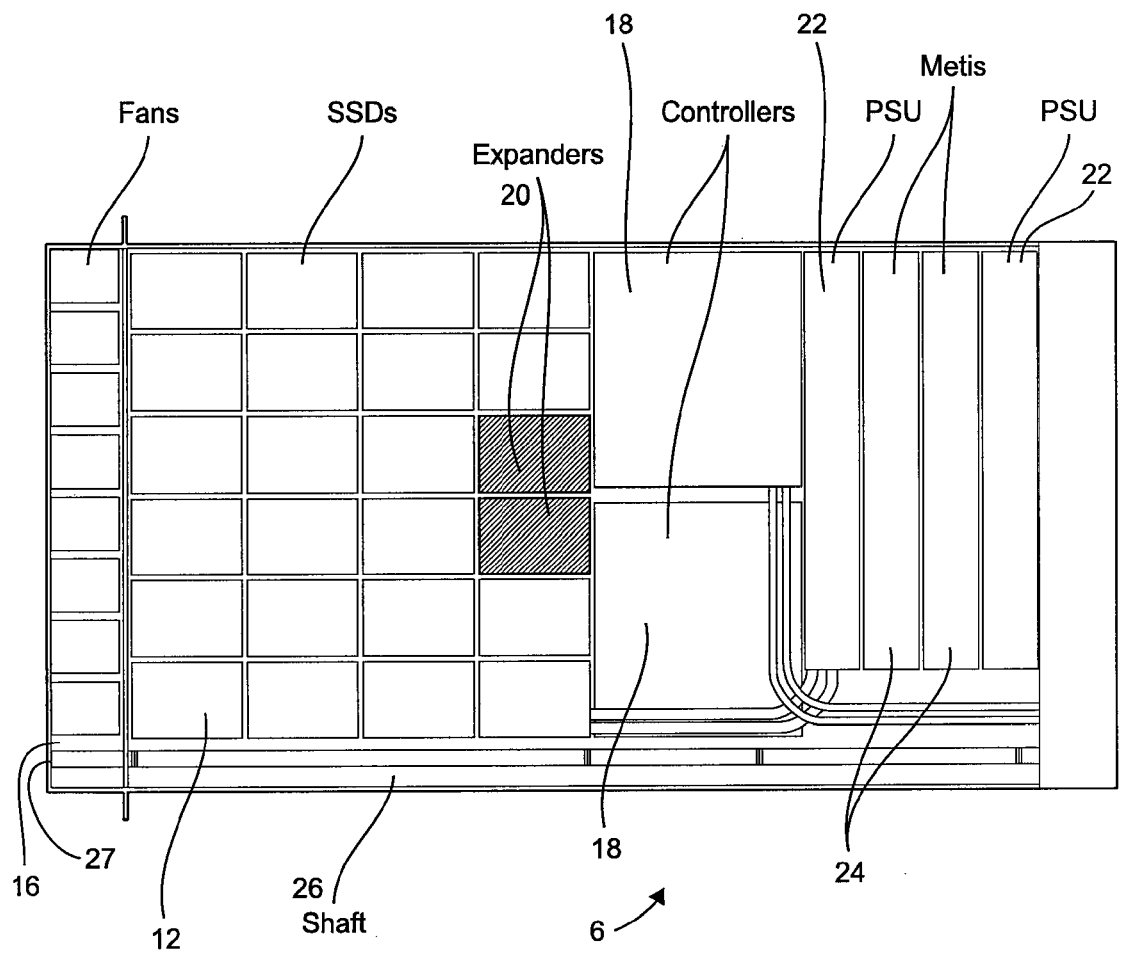
FIG. 4 shows a plan view of a drawer within a storage enclosure.

Before describing in detail the manner by which access to the storage media on the midplane 16 can be achieved, a brief description of one example of a general drawer layout will be provided, with reference to FIG. 4. FIG. 4 shows a plan view of a drawer with the lid 10 removed and the midplane 16 in a closed configuration. It is to be noted that the configuration of the drawer is merely exemplary and any suitable arrangement for such a storage enclosure drawer could be used.

The drawer 6, with its lid 10 removed, shows the configuration of the midplane 16. Plural storage media 12 are arranged in a regular array. The storage media, in this example, are solid state drives (SSDs) but, it will be appreciated, that other storage media could be used as well or instead of the SSDs. At least one controller 18 is provided in each drawer which provides management and control of devices in the drawer 6. In particular, the controllers 18 can function as input/output units to control the flow of data into and out of the storage media 12. In an alternative, dedicated I/O units are also provided.

To enable controlled communication and the transfer of data to and from the SSDs, between the plural SSDs and the controllers 18, two expanders 20 are preferably provided. Typically, the expanders are SAS expanders arranged in some desired connective configuration with the SSDs 12. The expanders effectively operate as multiport switches so as to switch passing data packets to selected ones of the storage media 12.

By use of various data transfer mechanisms, data may be transferred to the SSDs from the controllers or vice versa. The controllers 18 can thus act as an interface between the storage devices 12 and the outside world. In this case, the controllers 18 may be arranged to interface between the SSDs on one side and a host system on the other. Alternatively, in the example of a networked storage system the controllers 18 may be arranged to receive data from a remote network based storage system and forward it on one or more of the storage media within the storage enclosure.

Power supply units 22 are provided which ensure that the components of the drawer 6 are appropriately powered at all times. In this example, two independent power supply units 22 are provided thus enabling a degree of redundancy and back-up power in the event of a power failure.

In addition, in this example, as well as the power supply units 22, auxiliary back-up power is provided by the auxiliary power supply units 24. The auxiliary power supply units 24 may be as described, in detail, in our co-pending application no. US-A-2011/0072290, the entire content of which is hereby incorporated by reference. The precise configuration of the power supply units and the controllers 18 may be varied in accordance with a desired application.

As will be explained below, the midplane 16 is arranged so as to be pivotable with respect to the housing or drawer structure as a whole. In other words, it can be pivoted into an open configuration, in which the underside surface of the midplane 16 can be accessed directly. A shaft 26 is provided, pivotally mounted within the drawer 6 so as to enable the midplane to be moved into the open configuration. A locking nut 27 is provided on the end of the shaft 26 that is accessible from the front of the drawer 6. The locking nut 27 is used, in combination with a locking arm, described below, to enable the midplane 16 to be locked in an open (or closed) configuration.

Figure 3E:
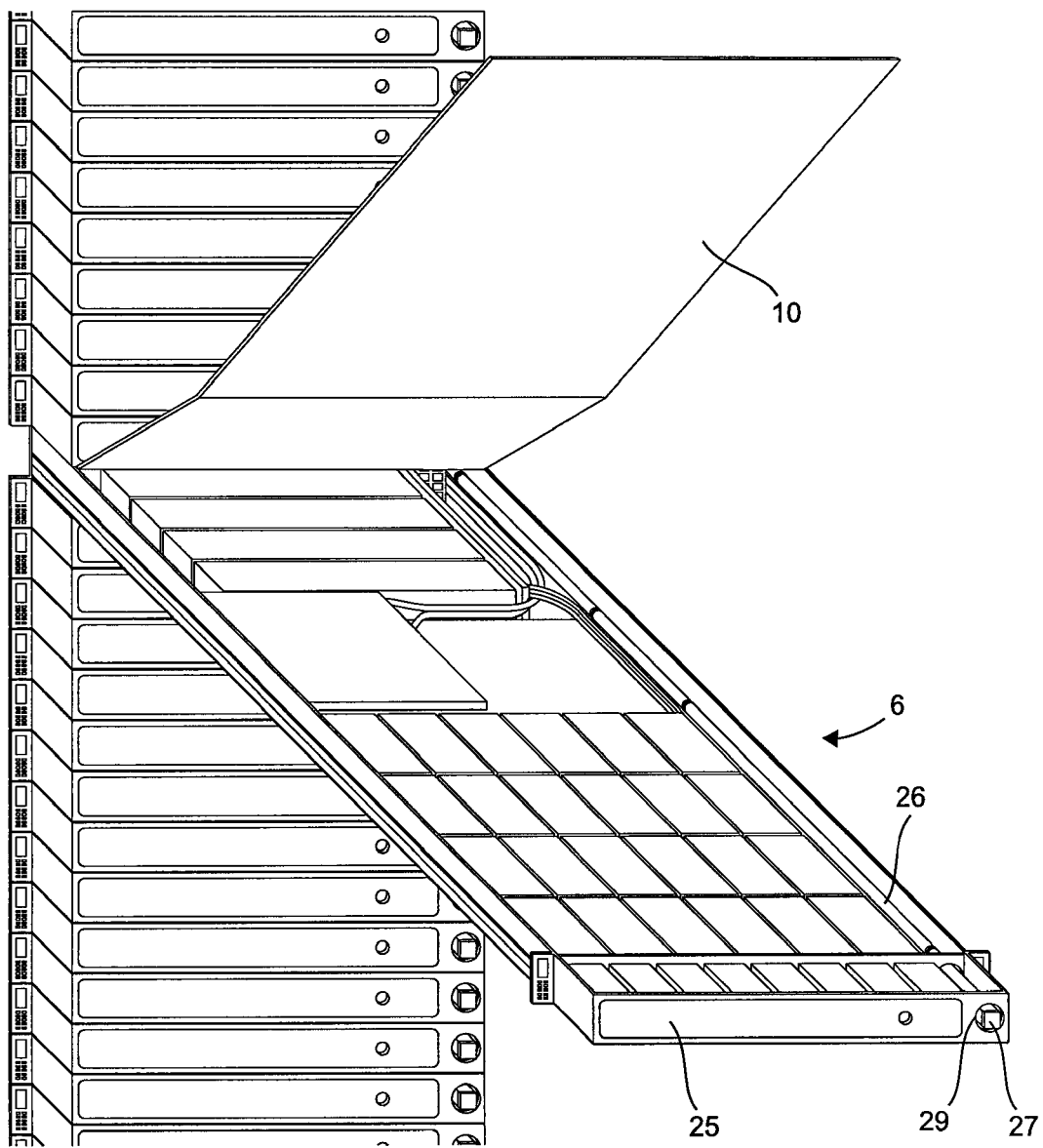
FIG. 3E shows a further example of a storage enclosure with a drawer-like structure with the drawer and lid in an open configuration.

Referring back to FIG. 3E, there is shown an alternative configuration of a drawer 6 having a lid 10. In this example, the lid 10 is pivoted towards the rear (preferably along the rear edge) of the drawer 6, instead of along one of the side edges of the drawer as in FIG. 3C. This enables the lid to rest against the remaining structure of the storage enclosure when in the open configuration. With the lid 10 in this position, the midplane 16 can then be pivoted into its open configuration. The shaft 26 is visible with the exposed locking nut 27. Preferably the front surface 25 of the drawer 6 has an opening 29 through which the locking nut 27 can be accessed.

Figure 5A:
FIG. 5A shows an end view of a single drawer.
Figure 5B:
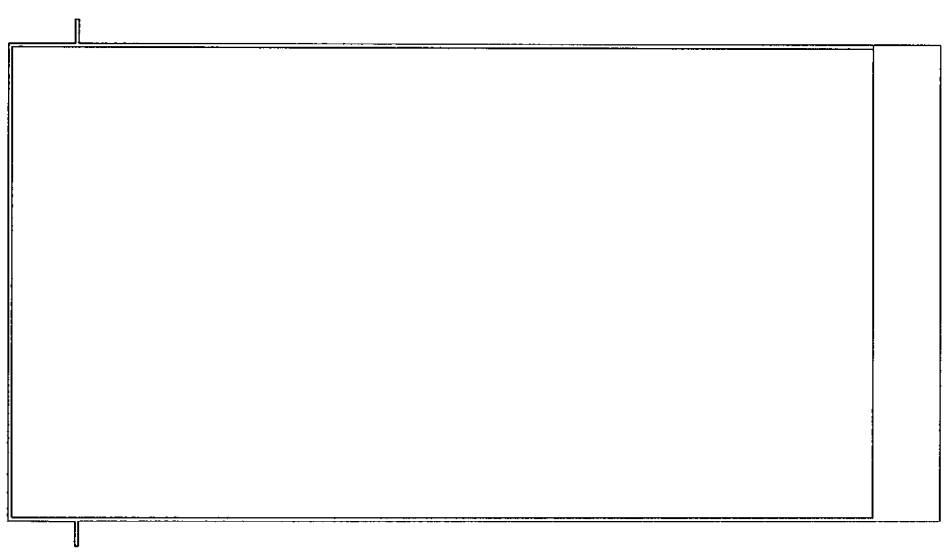
FIG. 5B shows a plan view from above of a single drawer.
Figure 5C:
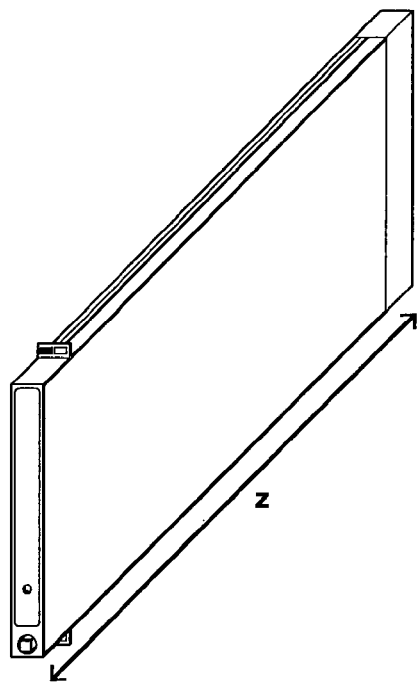
FIG. 5C shows a perspective view of a single drawer from a storage enclosure.

So as to demonstrate exemplary dimensions of the drawer 6, FIGS. 5A to 5C show schematic representation of a drawer 6 removed from the storage enclosure. FIG. 5A shows an end on view of the front surface of the drawer. FIG. 5B shows a plane view of the drawer 6 and FIG. 5C shows a perspective view of the draw from above. It will be appreciated that the drawer 6 is generally fairly flat in that the thickness Y of the drawer is significantly smaller than the width X or depth Z. Typically the dimensions of the drawer would be such that 440 mm<X<600 mm, 22 mm<Y<45 mm and 400 mm<Z<900 mm.

Figure 6:
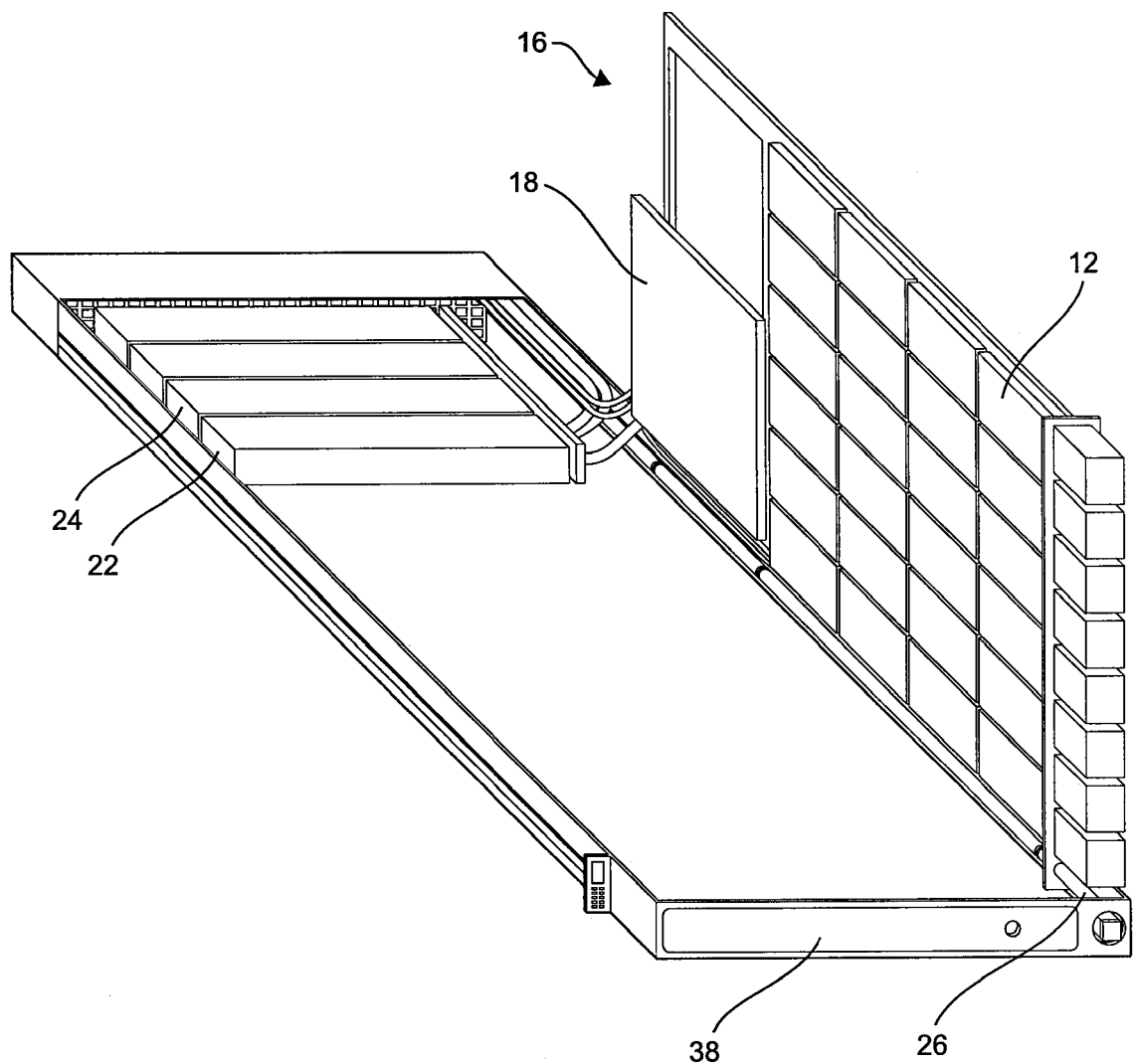
FIG. 6 shows a schematic representation of a single drawer from a storage enclosure with a midplane in an open configuration showing storage media on an underside of the midplane.

As mentioned above, some mechanism or arrangement of storage system is required which enables high availability to all storage media within the housing or enclosure. FIG. 6 shows a schematic representation of the drawer 6 of FIG. 3, in which the midplane 16 is in an open configuration. In this configuration, access to and availability of all storage media within the enclosure is enabled.

As can be seen, the midplane 16 has been pivoted about the shaft 26 such that storage media 12 on the underside (with respect to the drawer) of the midplane 16 are now accessible. A controller 18 is provided and one or more of the elements within the array of storage media 12 may be expanders 20 as shown in FIG. 4. Thus, the arrangement of the midplane 16 in this example is such that there are two substantially similarly arranged sides, both of which contain storage media and other associated components. Thus, the controllers are also provided on the pivoted midplane. This provides for ease of access and service to the controllers. Of course, the layout of the opposed sides of the midplane, could in other examples, be different from each other. This will typically be application specific.

The storage enclosure is particularly suited to use with solid state drives due to the fact that they are relatively low weight, high capacity and easily arranged on the midplane 16. As will be explained below with reference to FIG. 7A, the midplane 16 typically comprises a central PCB structure with solid state drives 12 mounted thereto.

As seen in FIG. 6, the power supply units 22 and auxiliary back-up power units 24 are typically not mounted on the pivotable midplane 16 although they could be if desired.

Figure 7A:
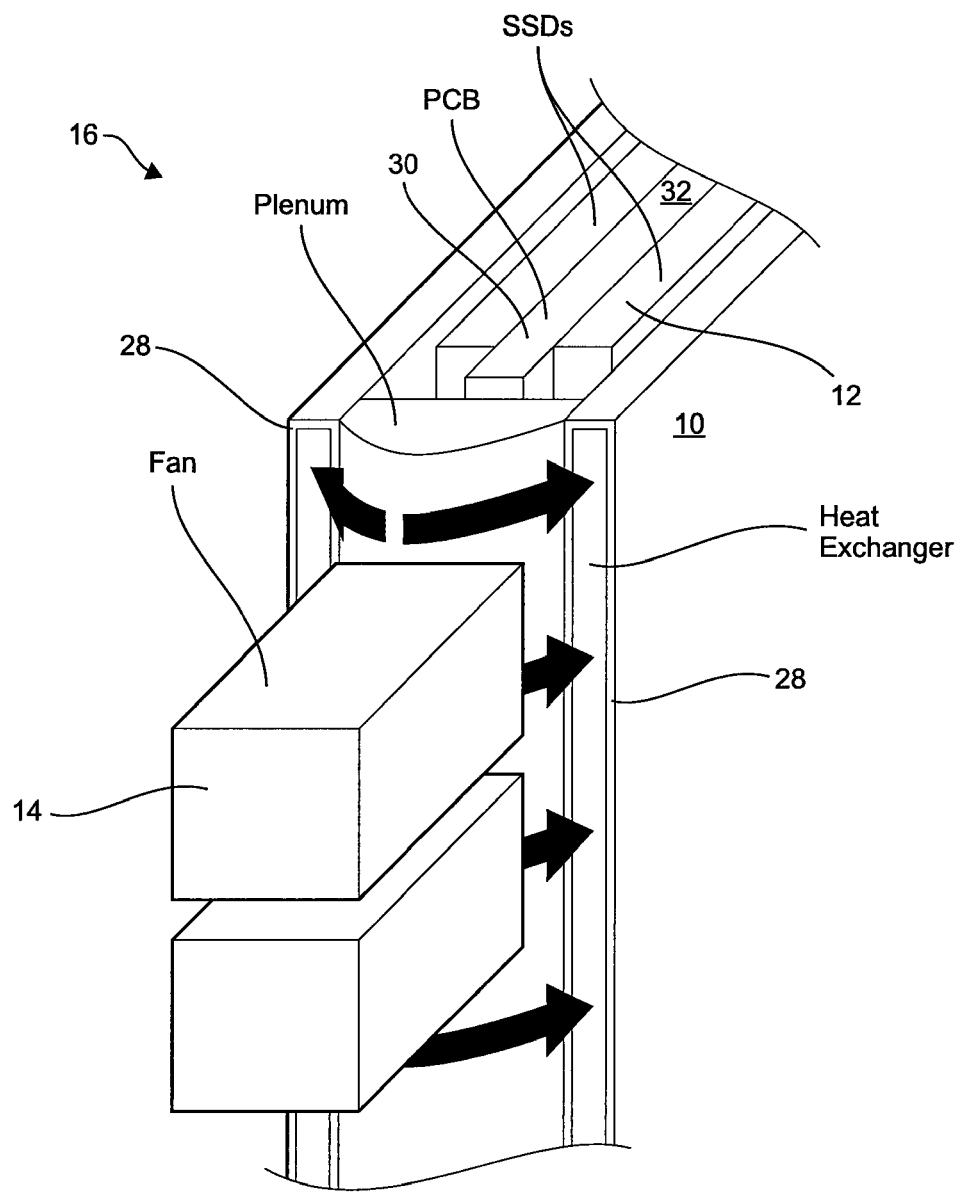
FIGS. 7A and 7B show schematic representations of temperature control features of a drawer within a storage enclosure.

Referring now to FIG. 7A, a section through a part of one example of drawer 6 is shown. Heat exchangers 28 are provided since it is preferable to be able to control the temperature of the SSDs and other components within the drawer 6. Fans 14 are provided arranged to generate a flow of air through heat exchangers 28. The heat exchangers 28 can be provided as separate components within the drawer 6 or can simply be provided by the bottom surface of the drawer and the lid 10. Thus, the drawer structure itself can provide heat exchange functionality. In such a case the drawer structure may be formed of heat-conductive material, such as a metal which is sufficiently heat-conductive to be able to receive heat from the storage devices and other components. Alternatively, this can be viewed as the heat exchanger itself being the drawer.

In the example shown, the heat exchangers provide passage for the flow of cooling air and are in close thermal contact with the SSDs 12 expanders, controllers etc within the storage enclosure, when the midplane is in a closed configuration, i.e. flat within the drawer. In one example, the heat exchangers could be provided with conduits or couplings for conduits for a heat transfer liquid such as water. A pump, not shown, may be provided in place of or as well as the fans 14, and be arranged to pump cooling liquid through the conduits in thermal communication with the SSDs and/or the heat exchangers otherwise resident in the enclosure. Indeed, the heat exchanger(s) may serve to cool the entire enclosure, either directly from heat sinks through conduction or through forced or natural convection.

The midplane 16, in this example, comprises a central PCB substrate 30 on which is mounted the plural storage media 12 and other associated components such as SAS expanders. The mounting of the SSDs on the PCB 30 can be achieved in any desired manner. Typically, the SSDs are bolted or welded to the PCB 30. Copper connectors may be provided as an integrated part of the PCBs or may be laid down specifically to provide connections to the SSDs and other components. It is of course within the knowledge of a skilled person to provide a PCB with SSDs arranged thereon.

In an embodiment, the right hand heat exchanger 10 is the removable lid from the drawer. The PCB 30 has a side edge 32 which runs along the longitudinal length of the drawer 6. On the opposite side edge 32 (not shown) the pivoting connection is provided such that the PCB 30 with the connected SSDs can be pivoted from the closed configuration in which the midplane is substantially flat within the drawer 6 to the open configuration as shown in, for example, FIG. 6.

Figure 7B:
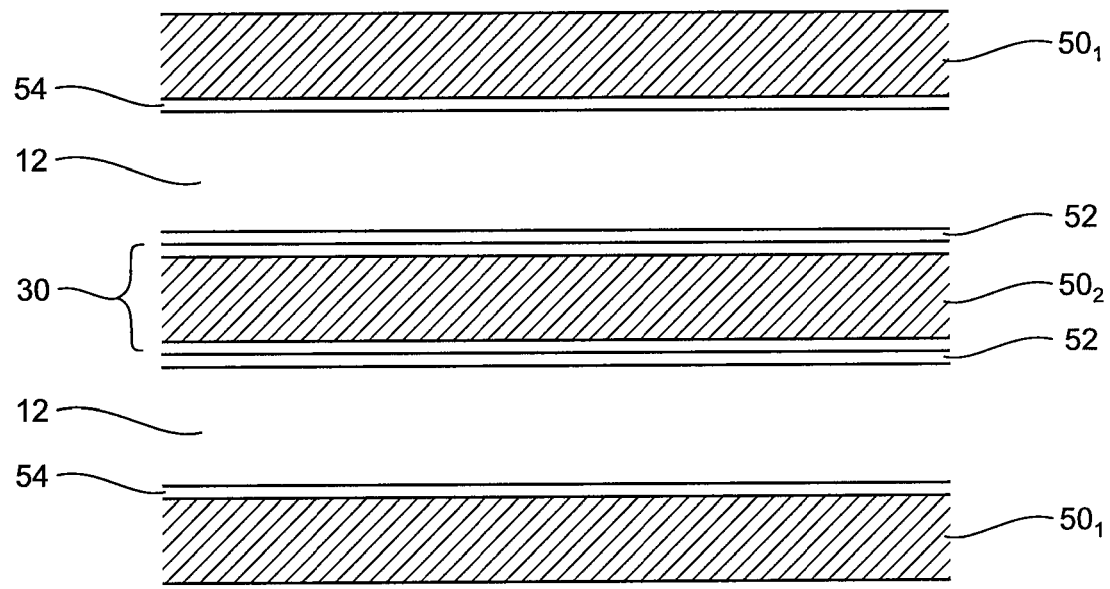

FIG. 7B shows a second example of a possible arrangement for the midplane 16. In this example, heat exchangers $50_1$ are provided as the outer components in the drawer as in the example of FIG. 7A. However, in addition a heat exchanger $50_2$ is provided integral to the central PCB structure 30. A thermal pad or layer 52 is preferably provided between the SSDs 12 and the PCB structure 30. In addition, a thermal conductive layer 54 may be provided on one or both of the heat exchangers $50_1$ so as to increase or maximise heat transfer to or from the SSDs 12.

Figure 8:
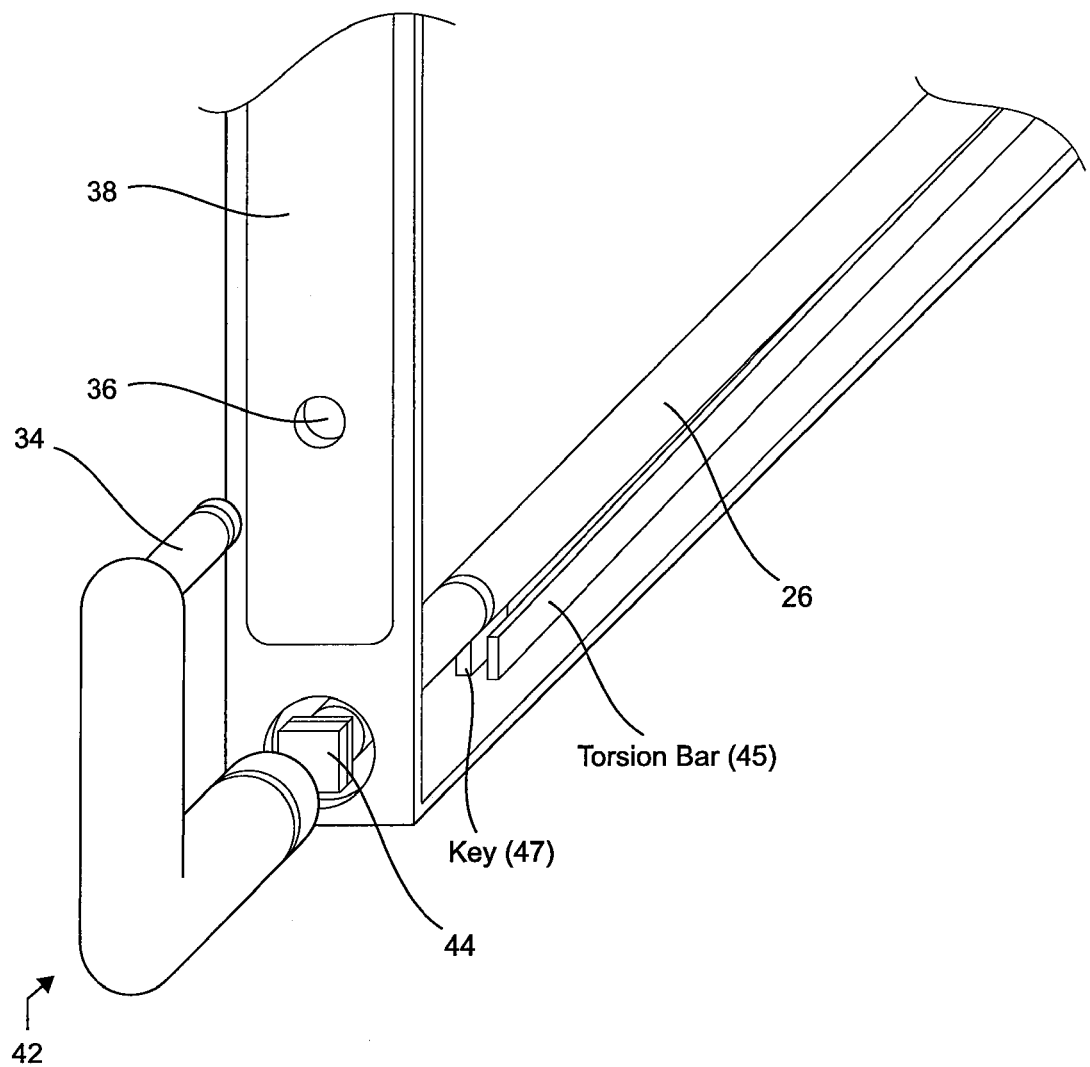
FIG. 8 shows an enlarged view of a locking mechanism for locking a midplane in an open configuration; and, FIGS. 9A and 9B show schematic representations of components from the locking mechanism of FIG. 8.
Figure 9A:
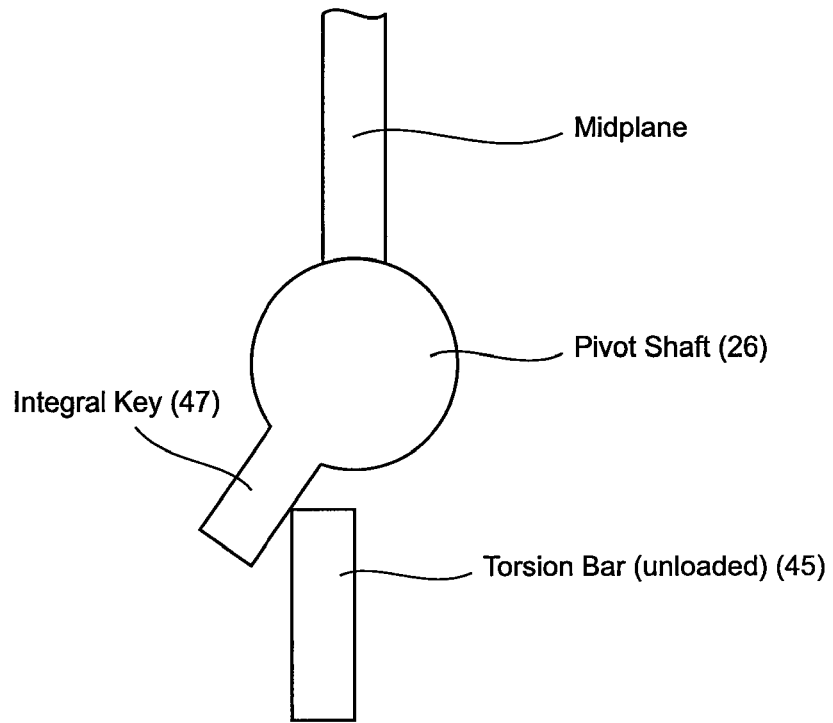
Figure 9B:
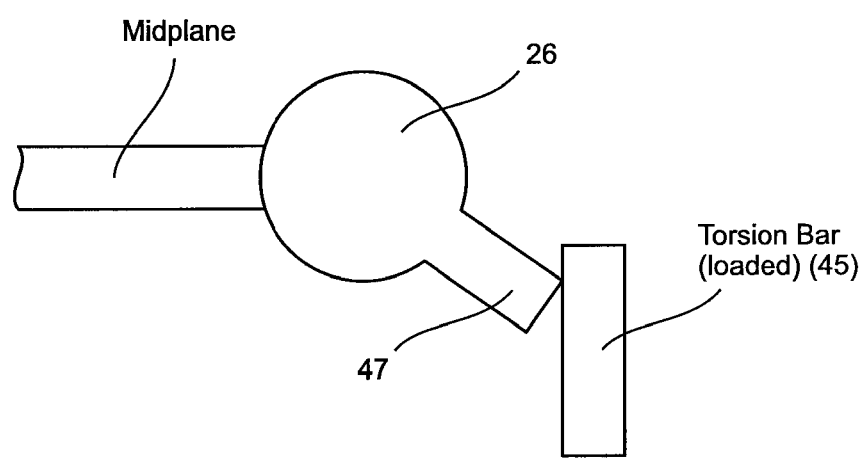

In a preferred embodiment, some means of locking the midplane 16 in the open configuration is provided. This ensures that once the drawer has been opened and the midplane rotated to its open configuration, an operator can access easily the storage media on the underside of the midplane 16 without having to take action to maintain the midplane in its open configuration. FIGS. 8, 9A and 9B show some examples of means by which this can be achieved.

In all of FIGS. 8, 9A and 9B, the arrangement is such that the midplane is biased to the open configuration, i.e. pivoted up from the base of the drawer. A torsion spring 45 is arranged to interact with an integral shaft key 47 such as to bias the key and the connected shaft into such a position that causes the midplane to be in its open configuration with respect to the drawer. This is advantageous as the spring bias provided by the torsion spring aids a user in lifting the midplane from the closed flat configuration to the upstanding open configuration.

A locking arm 42 is provided with a locking finger 34 at one end and a shaped recess (not shown) at the other. The locking finger 34 is arranged to engage an opening 36 in the end wall 38 of the drawer 6. The shaped recess is arranged to engage a locking nut 44 at the end of the shaft 26.

The locking finger 34 is provided as part (preferably an integral part) of the locking arm 42. The use of an integral locking finger reduces part count and enables a simple and reliable construction to be used. With the finger 34 engaged in the opening 36 and the square locking nut engaged by the shaped recess, the midplane 16 cannot be rotated about the shaft 26. In other words, the midplane is locked in the closed configuration against the bias of the torsion spring 45. However, the weight of the midplane may be sufficient to keep it in the closed configuration. The handle could be removed and stowed when the blade is used horizontally. In an example, the twist handle doubles as drawer/blade handle.

To unlock the midplane 16 and pivot it to the open configuration, the locking arm 42 is pulled such that the finger 34 is extracted from the opening 36 in the end face 38 of drawer 6. In one embodiment, this has the effect of freeing the square locking nut 44 on the end of shaft 26. With the locking nut 44 removed from the locking member 42, the shaft can rotate. Under force of the biasing torsion spring the midplane thus pivots upwards. The strength of the torsion spring can be selected as desired for a particular application. In some examples it is selected so as to be strong enough of itself to lift the midplane into the vertical (with respect to the plane of the drawer) position. In other examples it may be weaker than this so as to provide an assistive force to a user.

In an alternative example the substantially same configuration can be provided without the torsion spring 45 and/or key 47. In this example, there would be no biasing force to drive the midplane into an open configuration. A biasing force is provided in an appropriate manner so as to bias the locking arm 42 in the direction of the drawer and surface 38. In its rest position, the arm is therefore engaged with the opening 36 in the surface 38 and the locking nut 44. The interaction of the locking arm 42, finger 34 and nut 44 is therefore to lock the midplane into the open configuration once it has been pivoted open by a user.

To place the midplane in the open configuration, a user pulls the locking arm 42 away from the drawer so as to disengage the arm from both the locking nut 44 and the opening 36. The midplane 16 is then pivoted upwards to the open position. The arm is released to re-engage the opening 36 and the locking nut 44. The plane is then locked in the open configuration. To return the midplane to its closed configuration, the arm 42 is again pulled out of engagement with the opening 36 and locking nut 44 so as to allow the midplane 16 to return to a substantially flat orientation within the drawer 6.

In one embodiment one or more hydraulic arms (not shown) are provided so as damp the movement of the midplane in either direction (from open to closed or closed to open). This can be useful in ensuring smooth and controlled movement of the midplane between the open and closed configurations.

The shape of the locking nut and the corresponding opening can be used to determine the angular position of the midplane in its open configuration. In the example shown a rectangular (square in this particular example) locking nut is used. This ensures that the open configuration is a 90 degree rotation from the closed configuration. In other examples, differently shaped locking nuts can be used. For example, it might be desired that there are two different stable open configurations. This is readily achieved by appropriate shape selection for the locking nut 44 and corresponding opening in the locking arm 42. A regular hexagonal locking nut for example would provide a stable open configuration at angles of 60 and 120 degrees. Irregular shaped locking nuts could also be used having shapes that provide desired open configuration angles for the midplane 16.

It will be appreciated that this is merely one example by which with the use of relatively simple mechanical constructions, the midplane 16 can be releasably locked in either an open or closed position thereby enabling safe storage of the plane or safe fixing of the plane in an open configuration to enable secure access to the storage media.

In another embodiment, instead of the locking nut 44 being freed when the finger 34 is disengaged from the opening 36, the nut 44 slides within the recess but remains angularly engaged such that when the shaft rotates, the arm 42 rotates with it.

In the case when the locking arm 42 pivots with the shaft 26, a second opening in an end surface of the drawer can be provided to receive the locking finger 34 once the locking arm 42 has been pivoted. The finger 34 in this case may be moveable relative to the arm so as to enable it to be engaged or disengaged from the opening 36. Thus, again, the midplane can be locked in its open configuration.

FIGS. 9A and 9B show in greater detail how the torsion spring 45 engages in use with the integral shaft key 47. In FIG. 9A, the torsion spring is unloaded and the midplane 16 is in the open configuration. In FIG. 9B, the midplane is in the closed configuration and the torsion spring 45 is loaded. Thus, in this position the spring 45 provides a force that acts to drive the midplane into its open configuration.

Embodiments of the present invention have been described with particular reference to the examples illustrated. However, it will be appreciated that variations and modifications may be made to the examples described within the scope of the present invention.

The invention claimed is:

1. A storage enclosure, comprising:
    a housing slidingly extendable from and retractable into a storage enclosure rack along a movement axis;
    a pivotably mounted midplane assembly supported by the housing and comprising a printed circuit board (PCB) substrate with opposing first and second support surfaces, a first memory component affixed to the first support surface, a second memory component affixed to the second support surface, and a hinge assembly extending along a selected edge of the substrate to facilitate rotation of the midplane assembly about a substrate axis parallel to the movement axis between a closed position and an open position, the first support surface in facing parallel relation to a base surface of the housing in the closed position and extending at a non-parallel angle from the base surface to provide user access to the first and second memory components in the open position; and
    a locking mechanism coupled to the hinge assembly which respectively locks the midplane assembly in the closed position and in the open position.

2. The storage enclosure of claim 1, the base of the housing having opposing front and rear ends to define an overall length of the base and opposing side edges extending between the front and rear ends nominally parallel to the movement axis to define an overall width of the base, an overall width of the substrate substantially corresponding to the overall width of the base, the substrate axis about which the midplane axis rotates aligned with a selected one of the side edges of the base.

3. The storage enclosure of claim 1, the hinge assembly comprising a cylindrical shaft aligned along the substrate axis for rotation of the substrate thereabout, the shaft extending along and connected to the selected edge of the substrate, the locking mechanism engaging the shaft to lock the midplane assembly in the closed position and in the open position.

4. The storage enclosure of claim 3, the locking mechanism having a grip surface configured to be grasped by a hand of a user to rotate the midplane assembly between the closed and open positions, the locking mechanism retractable from the housing by the hand of the user so as to disengage the housing while remaining engaged with the shaft to facilitate rotation of the midplane assembly from the closed position to the open position.

5. The storage enclosure of claim 3, the shaft having opposing proximal and distal ends, the proximal end having a shaft keyed surface, the locking mechanism having a locking mechanism keyed surface that contactingly engages the shaft keyed surface to lock the midplane assembly in at least a selected one of the closed position and the open position.

6. The storage enclosure of claim 5, the locking mechanism further having a housing engagement keyed surface which contactingly engages the housing during engagement of the locking mechanism keyed surface with the shaft keyed surface to lock the midplane assembly in the at least a selected one of the closed position and the open position.

7. The storage enclosure of claim 1, further comprising a cooling assembly supported by the housing, the cooling assembly thermally coupled to the pivotably mounted midplane assembly to remove heat therefrom during operation of the first and second memory components.

8. The storage enclosure of claim 7, in which the cooling assembly comprises a heat exchanger supported by the substrate, the heat exchanger providing a conduit to direct a cooling fluid adjacent the first and second memory components.

9. The storage enclosure of claim 7, the cooling assembly comprising an electric fan configured to establish a flow of cooling air, a first heat exchanger which directs a first portion of the flow of cooling air proximate the first memory component, and a second heat exchanger which directs a second portion of the flow of cooling air proximate the second memory component.

10. The storage enclosure of claim 7, further comprising a programmable controller supported by the substrate, the cooling assembly thermally coupled to the programmable controller to remove heat therefrom during operation of the programmable controller.

11. A storage system comprising a storage enclosure rack with a plurality of axially aligned, individually extendable and retractable housing units each providing memory storage in a multi-device storage system, each of the housing units comprising:
  a rectangular housing slidingly extendable from and retractable into the storage enclosure rack along an associated movement axis, the housing having a base surface with opposing front and rear edges to define an overall base length, and a first side edge and an opposing second side edge to define an overall base width;
  a pivotably mounted midplane assembly supported by the housing, comprising:
    a printed circuit board (PCB) substrate with opposing first and second support surfaces each bounded by opposing front and rear edges to define an overall substrate length less than the overall base length and opposing first and second substrate side edges to define an overall substrate width nominally equal to the overall base width;
    a first memory component affixed to the first support surface;
    a second memory component affixed to the second support surface; and
    a hinge assembly comprising a shaft attached to the first substrate side edge of the substrate to facilitate rotation of the midplane assembly about a substrate axis parallel to the movement axis between a closed position and an open position, the first support surface in facing parallel relation to the base surface of the housing in the closed position and extending at a non-zero angle from the base surface to provide user access to the first and second memory components in the open position;
  a biasing mechanism which applies a biasing force to urge rotation of the midplane assembly to the open position; and
  a locking mechanism configured to contactingly engage the housing and the shaft to lock the midplane assembly in the closed position.

12. The storage system of claim 11, further comprising a programmable controller configured to direct data transfers with the first and second memory components mounted to the substrate.

13. The storage system of claim 11, each of the housing units further comprising a hinged cover member connected to a selected one of the rear edge or second side edge of the base for rotational movement between a closed cover position and an open cover position while the housing unit is in the retracted position, the cover member cooperating with the housing to enclose the midplane assembly in the closed cover position, the cover member facilitating rotation of the midplane assembly to the open position responsive to the cover member being first rotated to the open cover position.

14. A method comprising:
  slidably extending a rectangular housing from a storage enclosure rack along a movement axis;
  removing a cover member affixed to the housing; and
  pivotably rotating a midplane assembly mounted within the housing about a midplane axis parallel to the movement axis from a closed position to an open position, the midplane assembly comprising a printed circuit board (PCB) substrate with a first support surface supporting a first memory component, an opposing second support surface supporting a second memory component, and a hinge assembly comprising a shaft attached to an edge of the substrate aligned along a side edge of the housing and aligned with the midplane axis, the first support surface nominally parallel to a base surface of the housing in the closed position and extending at a non-parallel angle to the base surface in the open position; and
  locking the midplane assembly in the open position using a locking mechanism which contactingly engages the housing and the shaft.

15. The method of claim 14, the shaft comprising a keyed shaft surface at a selected end thereof, the midplane assembly locked in the open position by contactingly engaging the keyed shaft surface with a keyed locking mechanism surface of the locking mechanism.

16. The method of claim 14, the midplane assembly pivotably rotated to the open position by disengaging the locking mechanism from the housing and applying a rotational force to the locking mechanism to rotate the shaft, and thereby the substrate, to the open position.

* * * * *